US012770693B2

(12) United States Patent
Choi et al.

(10) Patent No.: US 12,770,693 B2
(45) Date of Patent: Oct. 20, 2026

(54) MEMORY ARRAY PROGRAMMING METHOD USING BITLINES AND MEMORY DEVICE FOR PERFORMING THE SAME

(71) Applicant: SAMSUNG ELECTRONICS CO., LTD., Suwon-si (KR)

(72) Inventors: Byeonghoon Choi, Suwon-si (KR); Myeonghee Oh, Suwon-si (KR); Hyuntaek Jung, Suwon-si (KR); Hanbyul Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 88 days.

(21) Appl. No.: 18/753,659

(22) Filed: Jun. 25, 2024

(65) Prior Publication Data

US 2025/0149097 A1 May 8, 2025

(30) Foreign Application Priority Data

Nov. 6, 2023 (KR) ........................ 10-2023-0151744

(51) Int. Cl.
*G11C 16/24* (2006.01)
*G11C 16/04* (2006.01)
(Continued)

(52) U.S. Cl.
CPC .............. *G11C 16/24* (2013.01); *G11C 16/04* (2013.01); *G11C 16/08* (2013.01); *G11C 16/10* (2013.01)

(58) Field of Classification Search
CPC ....... G11C 7/065; G11C 16/28; G11C 13/004; G11C 2013/0042; G11C 2013/0054; G11C 2213/79; G11C 7/08; G11C 2213/82; G11C 13/0026; G11C 16/32; G11C 7/062; G11C 7/12; G11C 13/0069; G11C 13/0023; G11C 13/0064; G11C 7/067; G11C 16/06; G11C 16/26; G11C 13/0007; G11C 13/003; G11C 16/0425; G11C 16/10; G11C 2013/0045; G11C 13/0028; G11C 13/0061;
(Continued)

(56) References Cited

U.S. PATENT DOCUMENTS 7,489,557 B2 2/2009 Kim et al.
7,545,678 B2 6/2009 Lee et al.
(Continued)

FOREIGN PATENT DOCUMENTS

EP 2 498 258 B1 1/2016
KR 10-2008-0033460 A 4/2008
(Continued)

*Primary Examiner* — Amir Zarabian
(74) *Attorney, Agent, or Firm* — Sughrue Mion, PLLC

(57) ABSTRACT

A memory device includes a memory cell array including a plurality of memory cells, respectively connected to a plurality of bitlines, a first multiplexer including a plurality of transistors connected to the plurality of bitlines, a reference circuit that generates reference current, a decoding circuit that transmits the reference current to the first multiplexer, and a control logic circuit connected to the reference circuit and the decoding circuit. The control logic circuit controls control the decoding circuit to apply the reference current to transistors, connected to each of at least two bitlines, such that predetermined first current flows through the at least two bitlines.

17 Claims, 9 Drawing Sheets

(51) Int. Cl.
*G11C 16/08* (2006.01)
*G11C 16/10* (2006.01)

(58) Field of Classification Search
CPC . G11C 16/12; G11C 16/14; G11C 2013/0066; G11C 2013/0078; G11C 2013/0083; G11C 2013/009; G11C 2213/32; G11C 2213/52; G11C 2213/56; G11C 5/145; G11C 11/5642; G11C 7/06; G11C 16/0433; G11C 16/3459; G11C 7/14; G11C 13/0038; G11C 16/04; G11C 16/24; G11C 11/34
USPC ......... 365/185.29, 207, 148, 185.18, 185.21, 365/189.09, 178, 185.13, 185.2, 203, 208, 365/126, 175, 185.03, 185.11, 185.22, 365/185.23, 185.33, 189.02, 189.06, 194, 365/206, 209, 210.1, 210.11, 210.12, 211, 365/226, 66
See application file for complete search history.

(56) References Cited

U.S. PATENT DOCUMENTS

| | | | | |
|---|---|---|---|---|
| 8,111,563 | B2 | 2/2012 | Kim et al. | |
| 8,238,158 | B2 * | 8/2012 | Shelton | G11C 16/10 365/185.21 |
| 8,395,924 | B2 | 3/2013 | Lee | |
| 2004/0156241 | A1 | 8/2004 | Mokhlesi et al. | |
| 2022/0157376 | A1 | 5/2022 | Franklin et al. | |

FOREIGN PATENT DOCUMENTS

| | | | |
|---|---|---|---|
| KR | 10-1373795 | B1 | 3/2014 |
| KR | 10-1399230 | B1 | 5/2014 |

* cited by examiner

MEMORY ARRAY PROGRAMMING METHOD USING BITLINES AND MEMORY DEVICE FOR PERFORMING THE SAME

CROSS-REFERENCE TO RELATED APPLICATION(S)

This U.S. non-provisional application is based on and claims priority under 35 USC § 119 to Korean Patent Application No. 10-2023-0151744, filed on Nov. 6, 2023, in the Korean Intellectual Property Office, the disclosure of which is herein incorporated by reference in its entirety.

BACKGROUND

1. Field

The disclosure relates to a memory device and a method of operating the memory device, and in particular, a method of programming a memory array in a memory device using a plurality of bitlines and a memory device for performing the same.

2. Description of Related Art

In a case in which a defect occurs inside a semiconductor memory device, the semiconductor memory device may malfunction. Therefore, a test may be performed to detect whether a defect has occurred in the semiconductor memory device and identify a cause of the defect.

However, a NOR flash memory has a structure, which allows data bits corresponding to a single word to be stored in a single program operation.

This results in an increase in time required to program or store data in memory cells to test a semiconductor device. In addition, as the individual test time for semiconductor memory devices increases, the overall productivity thereof may decrease.

SUMMARY

One or more aspects of the disclosure provide a memory device for simultaneously storing data in memory cells connected to different bitlines.

According to an aspect of the disclosure, there is provided a memory device including: a memory cell array including a plurality of memory cells, respectively connected to a plurality of bitlines; a first multiplexer including a plurality of transistors connected to the plurality of bitlines; a reference circuit configured to generate a reference current; a decoding circuit configured to transmit the reference current to the first multiplexer; and a control logic circuit configured to: control the decoding circuit to apply the reference current to at least two transistors among the plurality of transistors in the first multiplexer, the at least two transistors respectively connected to at least two bitlines among the plurality of bitlines.

According to another aspect of the disclosure, there is provided a memory system including: a memory device; and a memory controller configured to control the memory device, wherein the memory device includes: a memory cell array including a plurality of memory cells, respectively connected to a plurality of bitlines; a plurality of multiplexers, each including a plurality of transistors connected to each of a specific number of bitlines, among the plurality of bitlines; a reference circuit configured to generate reference current; a decoding circuit configured to transmit the reference current to the plurality of multiplexers; and a control logic circuit configured to apply the reference current to at least two transistors in a first multiplexer, among the plurality of multiplexers, based on a control signal transmitted from the memory controller.

According to another aspect of the disclosure, there is provided a method of operating a memory device including: receiving a first input related to an operation of the memory device; generating a reference current; transmitting the reference current to a decoding circuit based on the first input; and controlling the decoding circuit to apply the reference current to at least two transistors among a plurality of transistors in a first multiplexer, the at least two transistors respectively connected to at least two bitlines among a plurality of bitlines of a memory cell array.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Figure 1:
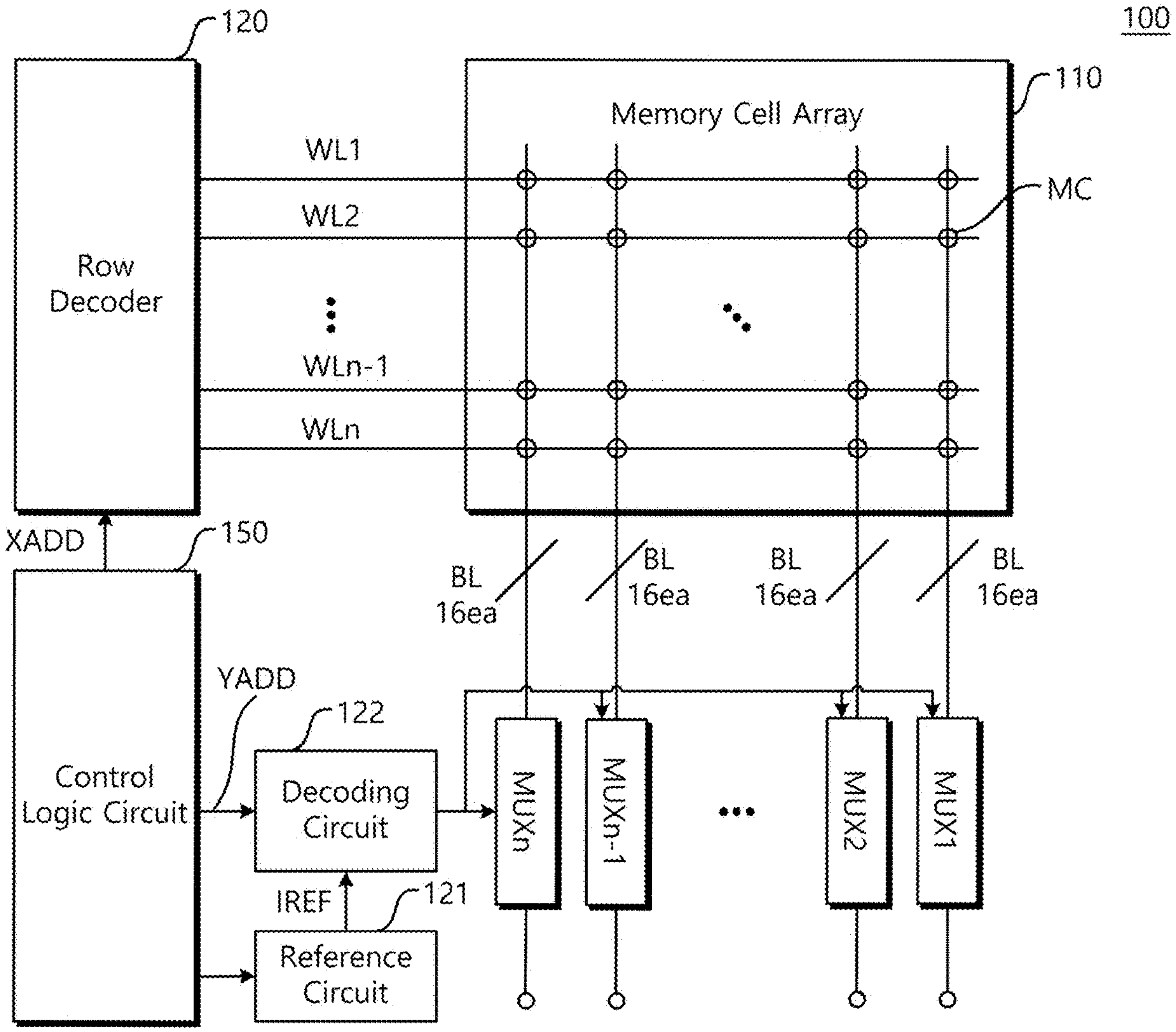
FIG. 1 is a block diagram of a memory device according to an example embodiment.

FIG. 1 is a block diagram of a memory device according to an example embodiment.

Referring to FIG. 1, according to an example embodiment, a memory device 100 may include a memory cell array 110, a row decoder 120, a control logic circuit 150, a reference circuit 121, a decoding circuit 122, and a plurality of multiplexers MUX1, MUX2 to MUXn (where n is a positive integer). However, the disclosure is not limited thereto, and as such, according to another embodiment, the memory device 100 may include one or more other components in addition to the components illustrated in FIG. 1. In some embodiments, one or more of the components illustrated in FIG. 1 may be omitted or combined with other components of the memory device 100.

According to an example embodiment, the memory device 100 may include a memory cell array 110 including a plurality of memory cells (MC).

For example, the memory cell array 110 may include a plurality of memory cells arranged in a matrix of rows and columns. The plurality of memory cells may be connected to a plurality of wordlines WL1 to WLn and a plurality of bitlines BL, respectively. Although FIG. 1 illustrates that the number of multiplexers MUX and the number of word lines WL are equal (e.g., WLn and MUXn), the disclosure is not limited thereto. As such, according to another embodiment, the number of wordlines WL may be a plurality of wordlines WL1 to WLm, where m is a positive integer different than n. According to another embodiment, the number of multiplexers may be a plurality of multiplexers MUX1, MUX2 to MUXp, where p is a positive integer different than n.

According to an example embodiment, the memory cell array 110 may include a plurality of volatile memory cells or a plurality of nonvolatile memory cells.

For example, a volatile memory may include, but is not limited to, a dynamic random access memory (DRAM), a static random access memory (SRAM), a thyristor RAM (TRAM), a zero capacitor RAM (Z-RAM), or a twin transistor RAM (TTRAM).

In addition, a nonvolatile memory may include, but is not limited to, an electrically erasable programmable read-only memory (EEPROM), a flash memory, a magnetic RAM (MRAM), a spin-transfer torque (MRAM), a conductive bridging RAM (CBRAM), a ferroelectric RAM (FeRAM), a phase change RAM (PRAM), a resistive RAM (RRAM), a nanotube RRAM, a polymer RAM (PoRAM), a nano floating gate memory (NFGM), a holographic memory, a molecular electronics memory device, or an insulator resistance change memory.

According to an example embodiment, the memory cell array 110 may be referred to as an embedded flash memory (eFlash memory). However, the disclosure is not limited thereto, and as such, in some example cases, the memory device 100 may be referred to the eFlash memory.

The memory cell array 110 may include a plurality of cell strings. For example, the memory cell array 110 may include a plurality of cell strings connected to each of a plurality of bitlines BL.

In an example embodiment, the plurality of memory cells may be arranged in a two-dimensional plane. For example, the plurality of memory cells may be implemented in a two-dimensional plane. However, the disclosure is not limited thereto, and as such, according to another example embodiment, the plurality of memory cells may be arranged (or implemented) in a three-dimensional manner. For example, the plurality of memory cells may be arranged in layers in a vertical direction.

Each of the plurality of memory cells may include a plurality of nonvolatile memory cells.

For example, the memory cell array 110 may include a plurality of nonvolatile memory cells connected in parallel. Therefore, the memory cell array 110 according to example embodiments may be referred to as a NOR flash memory.

In an example embodiment, the memory device 100 may include a plurality of multiplexers MUX1 to MUXn (where n is a positive integer), respectively connected to a plurality of bitlines BL.

For example, the memory device 100 may include a plurality of multiplexers MUX1 to MUXn, respectively connected to 16 bitlines.

Each of the plurality of multiplexers MUX1 to MUXn may output current flowing through at least a portion of the plurality of connected bitlines.

For example, each of the plurality of multiplexers MUX1 to MUXn may output current, received through at least a portion of the plurality of connected bitlines, based on a signal transmitted from the decoding circuit 122.

According to an example embodiment, each of the multiplexers MUX1 to MUXn may include a plurality of transistors connected to a plurality of bitlines.

For example, the first multiplexer MUX1 may include 16 transistors, respectively connected to the first to sixteenth bitlines. However, the disclosure is not limited thereto, and as such, the number transistors and the number bitlines may be different than 16. The first multiplexer MUX1 may output at least a portion of current received through the first to sixteenth bitlines.

In an example embodiment, the memory device 100 may include a reference circuit 121 configured to reference current IREF.

For example, the reference circuit 121 may generate reference current IREF having a value. The value may be predetermined value. For example, the reference circuit 121 may generate a reference current IREF having a value equal to a natural-number multiple of the first current required to store data in memory cells connected to a single bitline.

For example, the reference circuit 121 may have, for example, a current mirror structure or a current mirror circuit.

According to an example embodiment, the memory device 100 may include a row decoder 120 configured to select at least a portion of the plurality of wordlines WL1 to WLn.

For example, the row decoder 120 may select at least a portion of the plurality of wordlines WL1 to WLn by decoding a row address XADD and activating a corresponding wordline, among the wordlines WL1 to WLn. In an example case in which a wordline is activated a high power supply voltage higher than a power supply voltage VDD may be applied to a gate of an access transistor of a memory cell. For example, the wordline may be activated in a wordline enable operation.

The memory device 100 may include a decoding circuit 122 configured to select at least a portion of the plurality of bitlines BL. For example, the decoding circuit 122 may select at least a portion of the plurality of bitlines BLby transmitting a reference current IREF to at least a portion of the multiplexers MUX1 to MUXn. For example, the reference current IREF may be generated by the reference circuit 121.

In an example embodiment, the decoding circuit 122 may decode the column address YADD to activate at least a portion of the plurality of bitlines BL.

For example, the decoding circuit 122 may decode the column address YADD to generate column select signals for selecting at least a portion of the bitlines BL. For example, the column select signals may be implemented in the form of digital codes, but example embodiments are not limited thereto.

Also, the decoding circuit 122 may transmit the reference current IREF, generated by the reference circuit 121, to at least a portion of the plurality of multiplexers MUX1 to MUXn.

For example, decoding circuit 122 may transmit the reference current IREF to at least a portion of the plurality of bitlines, connected to the plurality of multiplexers MUX1 to MUXn, based on the column select signals generated by decoding the column address YADD.

In another embodiment, the decoding circuit 122 may transmit the reference current IREF to at least a portion of the plurality of transistors, respectively connected to the plurality of bitlines in each of the plurality of multiplexers MUX1 to MUXn, based on the column select signals generated by decoding the column address YADD. That is, the decoding circuit 122 may transmit the reference current IREF to at least a portion of the plurality of transistors in each of the plurality of multiplexers MUX1 to MUXn, based on the column select signals generated by decoding the column address YADD. However, the disclosure is not limited thereto, and as such, the decoding circuit 122 may transmit the reference current IREF to at least a portion of the plurality of transistors in one or more of the plurality of multiplexers MUX1 to MUXn.

Also, the memory device 100 may include a control logic circuit 150 connected to the row decoder 120, the decoding circuit 122, and the reference circuit 121.

The control logic circuit 150 according to an example embodiment may receive a command, address, or write data from a processor or memory controller. The control logic circuit 150 may generate a variety of control signals (for example, XADD and YADD) corresponding to an access operation, such as a program operation or a read operation, to the memory cell array 110 based on a command and an address.

The control logic circuit 150 may execute, for example, a software, a program or an instruction set to control one or more other components of the memory device 100 (for example, the decoding circuit 122 and/or the reference circuit 121), and perform various data processing or operations. The control logic circuit 150 may include a central processing unit or a microprocessor, and may control the overall operation of the memory device 100. According to an embodiment, the following operations performed by the memory device 100 may be understood as being performed under the control of the control logic circuit 150. However, the disclosure is not limited thereto, and as such, one or more operations performed by the memory device 100 may be based on another manner.

In an example embodiment, the control logic circuit 150 may include an algorithm for controlling at least a portion of the reference circuit 121 and the decoding circuit 122. For example, the algorithm may be a software code programmed inside the control logic circuit 150. For example, the algorithm may be a hard code hard-coded inside the control logic circuit 150, but example embodiments are not limited thereto.

In an example embodiment, the control logic circuit 150 may transmit the reference current IREF, generated by the reference circuit 121, to the decoding circuit 122 based on the algorithm. Also, the control logic circuit 150 may apply the reference current IREF to at least a portion of the multiplexers MUX1 to MUXn through the decoding circuit 122 based on the algorithm.

In an example embodiment, the control logic circuit 150 may apply reference current IREF to at least two transistors, among a plurality of transistors included in each of the plurality of the multiplexers MUX1 to MUXn, through the decoding circuit 122.

The operation, in which the control logic circuit 150 applies the reference current IREF to the transistors, may be understood as an operation in which the control logic circuit 150 applies a voltage, exceeding a threshold voltage of each transistor, to a gate electrode of each of the at least two transistors. For example, the control logic circuit 150 applies the voltage to the gate electrode of each of the at least two transistors based on the reference current IREF.

For example, the control logic circuit 150 may apply the reference current IREF to at least two transistors included in a specific multiplexer such that a first current flows through at least two bitlines, among a plurality of bitlines connected to the multiplexer. The first current may be a predetermined current.

In an example embodiment, the control logic circuit 150 may apply the reference current IREF to transistors arranged alternately, among transistors in each multiplexer. According to an embodiment, a pattern in which the transistors arranged alternately may refer the every other transistor in an arrangement of transistors in multiplexer. However, the disclosure is not limited thereto, and as such, according to another embodiment, the control logic circuit 150 may apply the reference current IREF to transistors in the multiplexer based on a different pattern. For example, the control logic circuit 150 may apply the reference current IREF to every third transistor in the multiplexer.

For example, the control logic circuit 150 may apply the reference current IREF to transistors connected to first, third, fifth, seventh, ninth, eleventh, thirteenth, and fifteenth bitlines, among the first to sixteenth bitlines connected to the first multiplexer MUX1, such that first current flows to the first, third, fifth, seventh, ninth, eleventh, thirteenth, and fifteenth bitlines.

In this case, as the control logic circuit 150 applies the reference current IREF to at least two transistors included in the first multiplexer MUX1, data may be programmed (or stored) in memory cells connected to bitlines to which the reference current IREF is applied.

Referring to the above-described configurations, according to an example embodiment, the control logic circuit 150 may apply the reference current IREF to at least two transistors included in the multiplexer. In this case, the first current may flow through bitlines connected to transistors to which the reference current IREF is applied.

Thus, the control logic circuit 150 may control the multiplexer so that current having the same value flows through the plurality of bitlines, regardless of a resistance (for example, line resistance) value of each bitline.

In addition, the control logic circuit 150 may store data simultaneously in memory cells connected to different bitlines.

As a result, the above-described configurations may allow the memory device 100 to reduce the time required to store data in the memory cell array 110.

For example, the memory device 100 may reduce the time required to store data in the memory cell array 110 so as to test the memory device 100.

Figure 2:
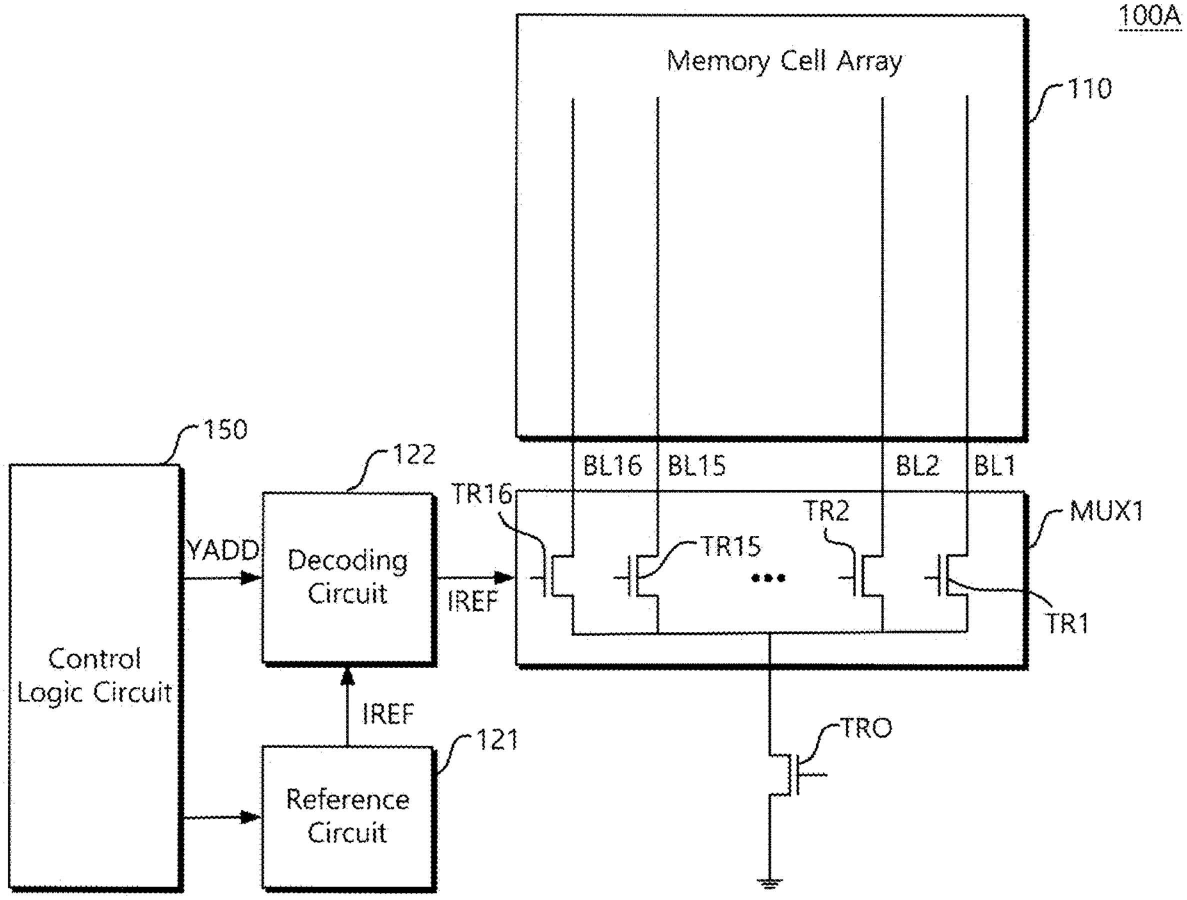
FIG. 2 is a block diagram of a memory device according to an example embodiment.
Figure 3:
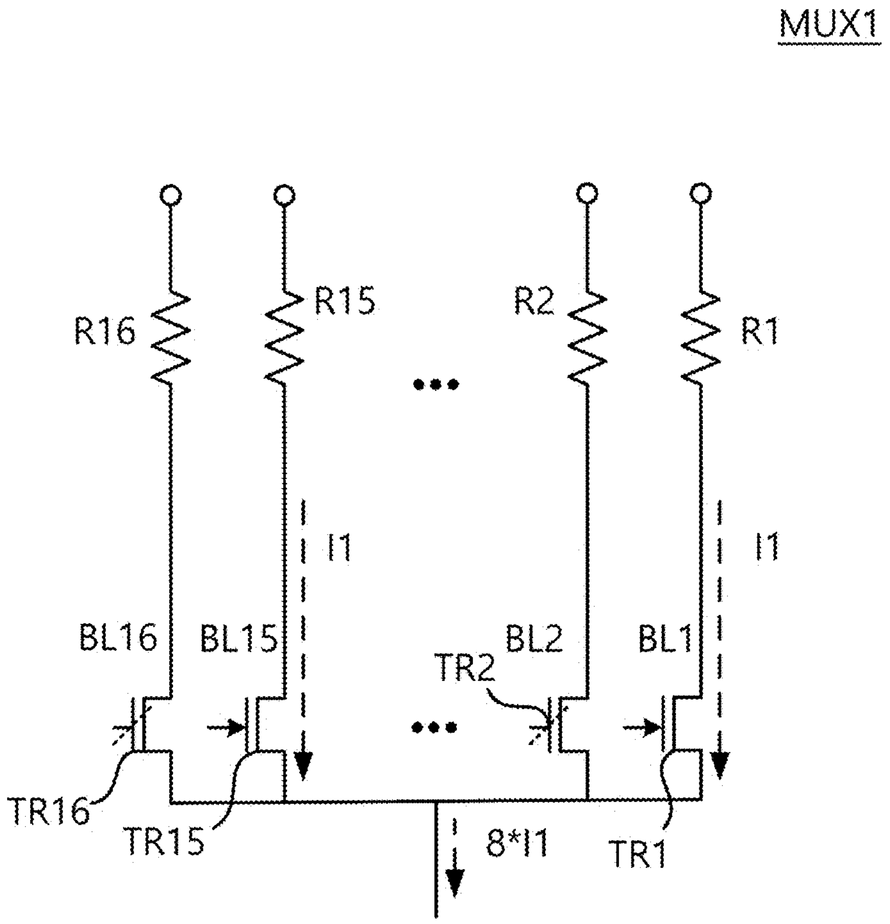
FIG. 3 is a circuit diagram illustrating a configuration of a first multiplexer according to an example embodiment.

FIG. 2 is a block diagram of a memory device according to an example embodiment, and FIG. 3 is a circuit diagram illustrating a configuration of a first multiplexer according to an example embodiment.

Referring to FIGS. 2 and 3, according to an example embodiment, a memory device 100A may include a memory cell array 110, a control logic circuit 150, a reference circuit 121, a decoding circuit 122, and a first multiplexer MUX1.

The memory device 100A may further include an output transistor TRO connected to the first multiplexer MUX1.

The memory device 100A illustrated in FIG. 2 may be understood as an example of the memory device 100 illustrated in FIG. 1. Therefore, the same or substantially the same elements have been represented by the same reference numerals, and redundant descriptions will be omitted. However, the disclosure is not limited thereto, and as such, other elements or components may be included in memory device 100A.

In an example embodiment, the memory device 100A may include a first multiplexer MUX1 connected to a plurality of bitlines BL1 to BL16. The first multiplexer MUX1 may include a plurality of transistors TR1 to TR16 connected to a plurality of bitlines BL1 to BL16.

In an example embodiment, the control logic circuit 150 may transmit the reference current IREF, to the decoding circuit 122. For example, the control logic circuit 150 may control the reference circuit 121 to output the reference current IREF, to the decoding circuit 122.

For example, the control logic circuit 150 may transmit the reference current IREF to the decoding circuit 122 based on a first input related to an operation mode of the memory device 100A. For example, the control logic circuit 150 may transmit the reference current IREF, generated by the reference circuit 121, to the decoding circuit 122 in response to a first input for the memory device 100A to operate in a first mode.

The first mode may be understood as an operation of inputting predetermined data to at least a portion of a plurality of memory cells included in the memory cell array 110 and reading the data from the memory cells to determine whether the memory device 100 is operating in a normal manner.

For example, the control logic circuit 150 may control the reference circuit 121 to transmit the reference current IREF generated by the reference circuit 121 to the decoding circuit 122 in response to the first input, in a state in which the reference current IREF generated by the reference circuit 121 is applied to the output transistor TRO.

For example, the control logic circuit 150 may control an electrical path between the reference circuit 121 and the decoding circuit 122 to transmit the reference circuit IREF from the reference circuit 121 to the decoding circuit 122 in response to the first input.

Furthermore, the control logic circuit 150 may control the decoding circuit 122 to apply the reference current IREF to the first multiplexer MUX1.

For example, the control logic circuit 150 may control the decoding circuit 122 to apply reference current IREF to at least two transistors, among the plurality of transistors TR1 to TR16 included in the first multiplexer MUX1.

The control logic circuit 150 may control the decoding circuit 122 to apply the reference current IREF to at least two transistors among the transistors TR1 to TR16 such that the first current flows to at least two bitlines among the plurality of bitlines BL1 to BL16.

In an example embodiment, the decoding circuit 122 may transmit the reference current IREF, generated by the reference circuit 121, to the first multiplexer MUX1.

The decoding circuit 122 may decode the column address YADD, transmitted from the control logic circuit 150, to generate column select signals.

Furthermore, the decoding circuit 122 may apply the reference current IREF to at least two transistors selected in the first multiplexer MUX1 according to the column select signal.

For example, the decoding circuit 122 may apply the reference current IREF to the first to eighth transistors TR1 to TR8 selected in the first multiplexer MUX1 according to the column select signal generated based on the column address YADD.

For example, the decoding circuit 122 may apply the reference current IREF to a first transistor TR1, a third transistor TR3, a fifth transistor TR5, a seventh transistor TR7, a ninth transistor TR9, an eleventh transistor TR11, a thirteenth transistor TR13, and a fifteenth transistor TR15 arranged alternately in the first multiplexer MUX1 according to the column select signal.

Referring to FIGS. 2 and 3, the control logic circuit 150 may apply the reference current IREF to transistors arranged alternately, among the transistors TR1 to TR16 included in the first multiplexer MUX1, through the decoding circuit 122.

In an example embodiment, the operation, in which the control logic circuit 150 or the decoding circuit 122 applies the reference current IREF to the transistors, may be understood as an operation in which the control logic circuit 150 applies a voltage, exceeding a threshold voltage of each transistor, to a gate electrode of each transistor using the reference current IREF.

For example, the control logic circuit 150 may control the decoding circuit 122 to apply the reference current IREF to the first transistor TR1, the third transistor TR3, the fifth transistor TR5, the seventh transistor TR7, the ninth transistor TR9, the eleventh transistor TR11, the thirteenth transistor TR13, and the fifteenth transistor TR15.

Accordingly, the first current I1 may flow through the first bitline BL1, the third bitline BL3, the fifth bitline BL5, the seventh bitline BL7, the ninth bitline BL9, the eleventh bitline BL11, the thirteenth bitline BL13, and the fifteenth bitline BL15 connected to transistors to which the reference current IREF is applied.

In this case, data may be programmed or stored in the memory cells connected to bitlines through which the first current I1 flows.

In an example case in which data is stored in the memory cells connected to the second bitline BL2, the fourth bitline BL4, the sixth bitline BL6, the eighth bitline BL8, the tenth bitline BL10, the twelfth bitline BL12, the fourteenth bitline BL14, and the sixteenth bitline BL16, the control logic circuit 150 may apply the reference current IREF to the second transistor TR2, the fourth transistor TR4, the sixth transistor TR6, the eighth transistor TR8, the tenth transistor TR10, the twelfth transistor TR12, the fourteenth transistor TR14, and the sixteenth transistor TR16.

Accordingly, the first current I1 may flow through the second bitline BL2, the fourth bitline BL4, the sixth bitline BL6, the eighth bitline BL8, the tenth bitline BL10, the twelfth bitline BL12, the fourteenth bitline BL14, and the sixteenth bitline BL16 connected to the transistors to which the reference current IREF is applied.

In an example embodiment, the control logic circuit 150 may apply the reference current IREF to the plurality of transistors TR1 to TR16 included in the first multiplexer MUX1 through the decoding circuit 122.

Accordingly, the first current I1 may flow through the plurality of bitlines BL1 to BL16 connected to the transistors to which the reference current IREF is applied.

As a result, the control logic circuit 150 may program data simultaneously in memory cells, connected to each of the plurality of bitlines BL1 to BL16.

According to an example embodiment, the first multiplexer MUX1 may output current, equal to the product of the first current I1 and the number of transistors to which the reference current IREF is applied, based on the reference current IREF being applied to the first multiplexer MUX1.

For example, referring to FIG. 3, the first multiplexer MUX1 may output current equal to the product of the first current I1 and "8" (8*I1), in response to the reference current IREF being applied to eight transistors TR1, TR3, TR5, TR7, TR9, TR11, TR13, and TR15 among the plurality of transistors TR1 to TR16.

Furthermore, the current output from the first multiplexer MUX1 may be output to the outside of the memory device 100A through the output transistor TRO.

For example, the control logic circuit 150 may apply a voltage, greater than or equal to a threshold voltage of the output transistor TRO, such as a power supply voltage VDD, to a gate electrode of the output transistor TRO.

Referring to the above-described configurations, the control logic circuit 150 according to an example embodiment may apply the reference current IREF to the plurality of transistors included in the first multiplexer MUX1 such that current having the same value (for example, the first current I1) flows through the plurality of bitlines.

The plurality of bit lines BL1 to BL16 may have internal resistances (or intrinsic resistances) R1, R2 to R15, R16, respectively.

Accordingly, the control logic circuit 150 according to an example embodiment may control the reference circuit 121 and/or the decoding circuit 122 such that specified current flows through a plurality of bitlines, regardless of the respective resistances R1, R2 to R15, R16 of the bitlines.

As a result, the memory device 100A according to an example embodiment may significantly reduce an effect caused by a resistance value of each bitline in a case in which data is programmed in memory cells through the plurality of bitlines.

In addition, the control logic circuit 150 may apply the reference current IREF to the first multiplexer MUX1 to simultaneously program data in memory cells connected to different bitlines.

As a result, the memory device 100A according an example embodiment may reduce the time required to store data in the memory cell array 110.

For example, the memory device 100A according to an example embodiment may reduce the time required to store data in the memory cell array 110 so as to test the memory device 100A.

Figure 4:
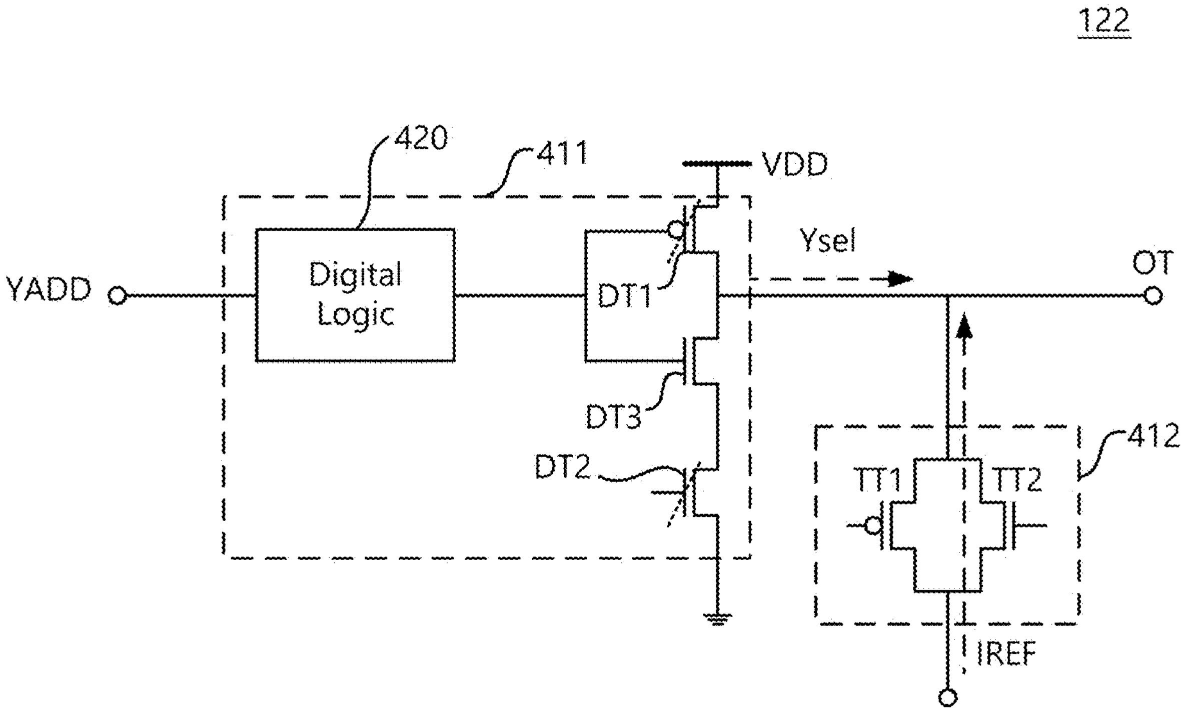
FIG. 4 is a circuit diagram illustrating a configuration of a decoding circuit according to an example embodiment.

FIG. 4 is a circuit diagram illustrating a configuration of a decoding circuit according to an example embodiment.

Referring to FIG. 4, a decoding circuit 122 according to an example embodiment may include a driver circuit 411 and a transmission circuit 412.

The decoding circuit 122 illustrated in FIG. 4 may be understood as an example of the decoding circuit 122 illustrated in FIG. 1.

According to an example embodiment, the decoding circuit 122 may include a driver circuit 411 and a transmission circuit 412. The driver circuit 411 may include a digital logic 420. However, the disclosure is not limited thereto, and as such, the decoding circuit 122 may include other elements or components.

The driver circuit 411 may decode a column address YADD, transmitted from a control logic circuit 150. For example, the driver circuit 411 may use the digital logic 420 to decode the column address YADD. According to an embodiment, the driver circuit 411 may generate a column select signal Ysel based on a result of decoding the column address YADD.

The column select signal Ysel may include information on at least two transistors, among a plurality of transistors included in a first multiplexer MUX1.

For example, the column select signal Ysel may be implemented in the form of a digital code.

Accordingly, the column select signal Ysel may be referred to as a first digital code for the control logic circuit 150 to apply reference current IREF to the at least two transistors included in the first multiplexer MUX1.

According to an example embodiment, the driver circuit 411 may include a plurality of driver transistors DT1, DT2, and DT3.

For example, the driver circuit 411 may include a first driver transistor DT1 connected to a power supply voltage VDD, a second driver transistor DT2 connected to a ground, and a third driver transistor DT3 connected between the first driver transistor DT1 and the second driver transistor DT3.

According to an embodiment, the digital logic 420, the first driver transistor DT1, and the third driver transistor DT3 may be implemented as a standard cell, but the disclosure is not limited thereto.

According to an example embodiment, the control logic circuit 150 may output the column select signal Ysel, generated from the digital logic 420, to an output terminal OT.

For example, the control logic circuit 150 may turn off the first driver transistor DT1 and the second driver transistor DT2 based on a first input for the memory device 100 to operate in the first mode.

In addition, the control logic circuit 150 may turn on the third driver transistor DT3 based on the first input to operate in the first mode.

The first mode may be understood as an operation of inputting predetermined data to a plurality of memory cells included in the memory cell array 110 and reading the data from the memory cells to determine whether the memory device 100 operates normally.

Accordingly, for example, the first mode may be referred to as a test mode.

For example, the control logic circuit 150 may control the decoding circuit 122 to output the column select signal Ysel, generated by the digital logic 420, to the output terminal OT through the third driver transistor DT3.

According to an example embodiment, the decoding circuit 122 may include a transmission circuit 412 configured to transmit the reference current IREF, from the reference circuit 121, to the first multiplexer MUX1.

In an example embodiment, the control logic circuit 150 may turn on the transmission circuit 412 in response to a first input for the memory device 100 to operate in a first mode. This may allow the transmission circuit 412 to transmit the reference current IREF, transmitted from the reference circuit 121, to the first multiplexer MUX1.

For example, the control logic circuit 150 may turn on a transistor (TT1 or TT2) included in the transmission circuit 412 in response to the first input. In this case, the reference current IREF generated by the reference circuit 121 may be transmitted to an output terminal OT of the decoding circuit 122 through the transmission circuit 412. According to an embodiment, the output terminal may include a plurality of terminals. For example, the output terminal may include one or more terminals corresponding to the electrical lines from the driver circuit 411 and one or more terminals corresponding to the electrical lines from the transmission circuit 412. However, the disclosure is not limited thereto, and as such, the column select signal Ysel and the reference IREF may be alternatively output by the output terminal OT.

In an example embodiment, the control logic circuit 150 may turn on the third driver transistor DT3 and the transmission circuit 412 in response to the first input. Also, the control logic circuit 150 may turn off the first driver transistor DT1 and the second driver transistor DT2 in response to the first input.

The control logic circuit 150 may control the decoding circuit 122 to apply the reference current IREF to at least two transistors, among the plurality of transistors included in the first multiplexer MUX1.

For example, the control logic circuit 150 may apply the reference current IREF, transmitted through the transmission circuit 412, to at least two transistors of the first multiplexer MUX1 selected by a column select signal Ysel generated through the digital logic 420.

Accordingly, the control logic circuit 150 may simultaneously program (or store) data in memory cells, connected to different bitlines, using bitlines connected to a plurality of transistors to which the reference current IREF is applied.

Referring to the above-mentioned configurations, according to an example embodiment, the control logic circuit 150 may control the decoding circuit 122 to apply the reference current IREF to at least two transistors included in the first multiplexer MUX1. In this case, the first current may flow through the bitlines connected to the transistors to which the reference current IREF is applied.

In addition, the control logic circuit 150 may store data simultaneously in memory cells, connected to different bitlines, using a plurality of bitlines through which the first current flows.

Accordingly, the above-mentioned configurations may allow the memory device 100 according to an example embodiment to reduce the time required to store data in the memory cell array 110.

For example, the memory device 100 may reduce the time required to store data in the memory cell array 110 so as to test the memory device 100.

In an example embodiment, the control logic circuit 150 may turn off the third driver transistor DT3 and the transmission circuit 412 based on a second input for the memory device 100 to operate in a second mode. Also, the control logic circuit 150 may turn on the first driver transistor DT1 and the second driver transistor DT2 based on a second input.

For example, the second mode may be referred to as an operation mode.

The control logic circuit 150 may output a second digital code for applying a voltage, greater than or equal to a threshold voltage, to one of the transistors TR1 to TR16 included in the first multiplexer MUX1 using the digital logic 420.

Also, the control logic circuit 150 may apply the reference current IREF, generated by the reference circuit 121, to the output transistor TRO based on the second input.

The control logic circuit 150 may transmit the second digital code for turning on one of the transistors TR1 to TR16 to the first multiplexer MUX1 through the decoding circuit 122.

This may allow the control logic circuit 150 to store data in memory cells connected to a bitline connected to the turned-on transistor.

Referring to the above-described configurations, the control logic circuit 150 may control the decoding circuit 122 such that the memory device 100 operates in different modes.

According to an embodiment, the control logic circuit 150 may control the decoding circuit 122 such that the memory device 100 operates in the first mode of simultaneously storing data is memory cells connected to different bitlines in the first multiplexer MUX1.

According to another embodiment, the control logic circuit 150 may control the decoding circuit 122 such that the memory device 100 operates in a second mode of storing data in memory cells connected to a single bitline in the first multiplexer MUX1.

Through the above-described configurations, the memory device 100 according to an example embodiment may operate in different modes using a single decoding circuit 122. Accordingly, the memory device 100 may reduce an area of a circuit required to operate in different modes.

Figure 5:
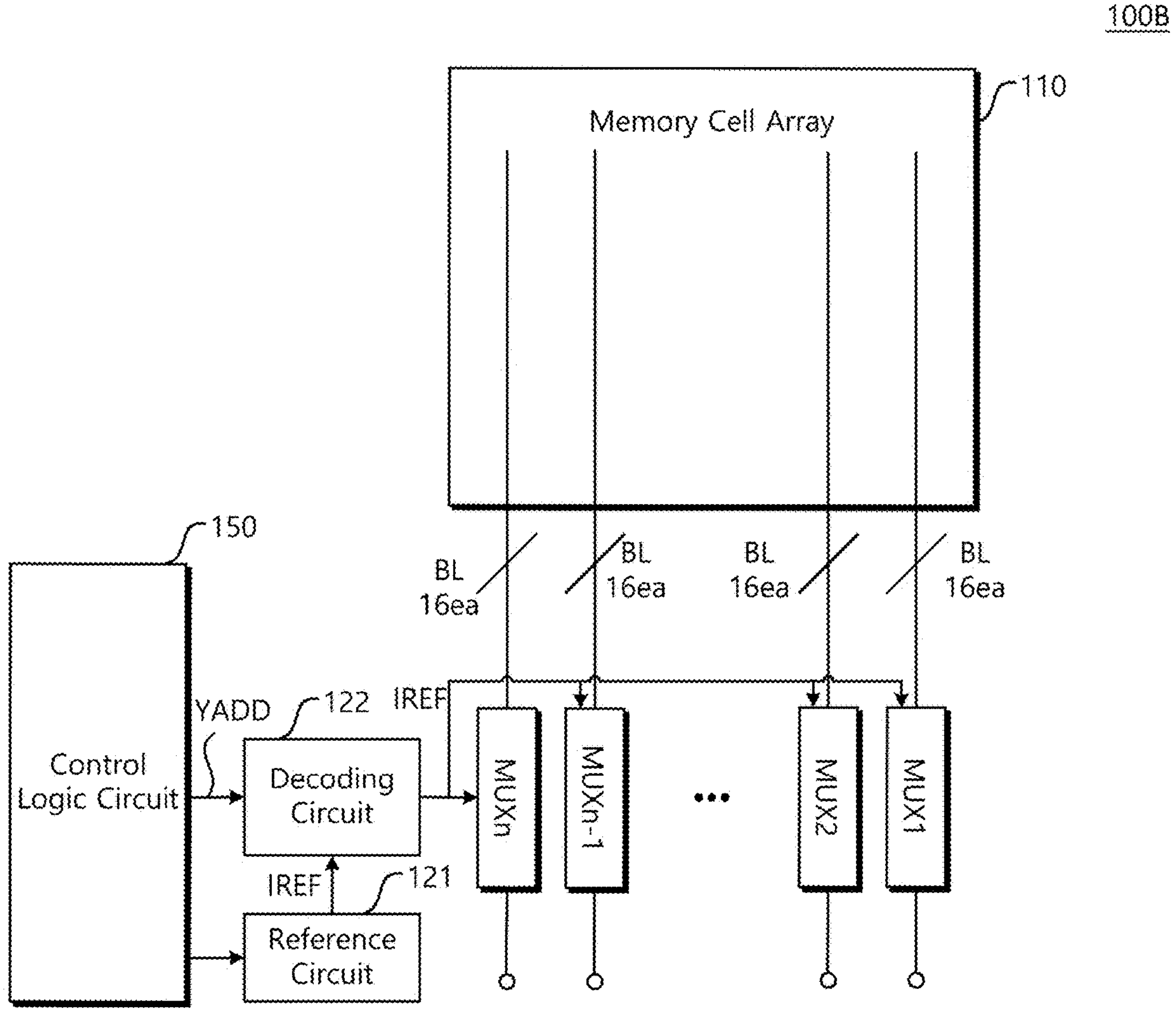
FIG. 5 is a block diagram of a memory device according to an example embodiment.

FIG. 5 is a block diagram of a memory device according to an example embodiment.

Referring to FIG. 5, a memory device 100B according to an example embodiment may include a memory cell array 110, a control logic circuit 150, a reference circuit 121, a decoding circuit 122, and a plurality of multiplexers MUX1 to MUXn. However, the disclosure is not limited thereto, and as such, the memory device 100B may include other components.

The memory device 100B illustrated in FIG. 5 may be understood as an example of the memory device 100 illustrated in FIG. 1. Therefore, the same or substantially the same elements have been represented by the same reference numerals, and redundant descriptions will be omitted.

In an example embodiment, the memory device 100B may include a plurality of multiplexers MUX1 to MUXn, each connected to a plurality of bitlines.

Additionally, each of the multiplexers MUX1 to MUXn may include a plurality of transistors, respectively connected to a plurality of bitlines.

In an example embodiment, the control logic circuit 150 may transmit reference current IREF, output from the reference circuit 121, to the decoding circuit 122.

For example, the control logic circuit 150 may transfer the reference current IREF, generated by the reference circuit 121, to the decoding circuit 122 in response to a first input for the memory device 100B to operate in a first mode.

For example, the control logic circuit 150 may control the reference circuit 121 to transmit the reference current IREF from the reference circuit 121 to the decoding circuit 122 in response to the first input, in a state in which the reference current IREF generated by the reference circuit 121 is applied to the output transistor TRO.

Furthermore, the control logic circuit 150 may control the decoding circuit 122 to apply the reference current IREF to at least a portion of the plurality of multiplexers MUX1 to MUXn.

The operation, in which the control logic circuit 150 (or the decoding circuit 122) applies the reference current IREF to the transistors, may be understood as an operation in which the control logic circuit 150 applies a voltage, exceeding a threshold voltage of each transistor, to a gate electrode of each transistor.

For example, the control logic circuit 150 may control the decoding circuit 122 to apply the reference current IREF to at least two transistors, among the plurality of transistors included in each of the plurality of multiplexers MUX1 to MUXn.

For example, the control logic circuit 150 may control the decoding circuit 122 to apply the reference current IREF to at least two transistors, among the plurality of transistors TR1 to TR16 included in the first multiplexer MUX1.

For example, the control logic circuit 150 may control the decoding circuit 122 to apply the reference current IREF to at least two transistors, among the plurality of transistors TR1 to TR16 included in the first multiplexer MUX1, such that first current flows through at least two bitlines among the plurality of bitlines BL1 to BL16.

In an example embodiment, the decoding circuit 122 may transmit the reference current IREF, generated by the reference circuit 121, to each of the plurality of multiplexers MUX1 to MUXn.

The decoding circuit 122 may decode a column address YADD, transmitted from the control logic circuit 150, to generate column select signals.

In addition, the decoding circuit 122 may apply the reference current IREF to at least two transistors, selected from each of the plurality of multiplexers MUX1 to MUXn, according to the column select signals.

For example, the control logic circuit 150 may apply the reference current IREF to transistors arranged alternately, among the plurality of transistors included in each of the multiple multiplexers MUX1 to MUXn, through the decoding circuit 122.

For example, the decoding circuit 122 may apply the reference current IREF to the first transistor TR1 to the eighth transistor TR8, selected from the first multiplexer MUX1, according to the column select signal generated based on the column address YADD.

As a result, first current I1 may flow through bitlines connected to the transistors to which the reference current IREF is applied.

In addition, data may be programmed or stored in the memory cells connected to the bitlines through which the first current I1 flows.

As a result, the control logic circuit 150 may program or store data simultaneously in memory cells connected to different bitlines using a plurality of bitlines connected to each of the plurality of multiplexers MUX1 to MUXn.

In addition, each of the plurality of multiplexers MUX1 to MUXn may output current, equal to the product of the first current I1 and the number of transistors, to which the reference current IREF is applied, among the plurality of transistors, in response to the reference current IREF being applied.

For example, referring to FIGS. 3 and 5, the first multiplexer MUX1 may output current, equal to the product of the first current I1 and "8" (8*I1), in response to the reference current IREF being applied to eight transistors TR1, TR3, TR5, TR7, TR9, TR11, TR13, and TR15 among the plurality of transistors TR1 to TR16.

Referring to the above-described configurations, the control logic circuit 150 according to an example embodiment may apply the reference current IREF to the plurality of transistors included in each of the plurality of multiplexers MUX1 to MUXn such that currents having the same value (for example, the first current I1) flow through a plurality of bitlines.

As a result, the control logic circuit 150 may apply the reference current IREF to each of the plurality of multiplexers MUX1 to MUXn to simultaneously program or store data in memory cells connected to different bitlines.

This may allow the memory device 100B according to an example embodiment may reduce the time required to store data in the memory cell array 110.

For example, the memory device 100B may reduce the time required to store data in the memory cell array 110 so as to test the memory device 100B.

Figure 6:
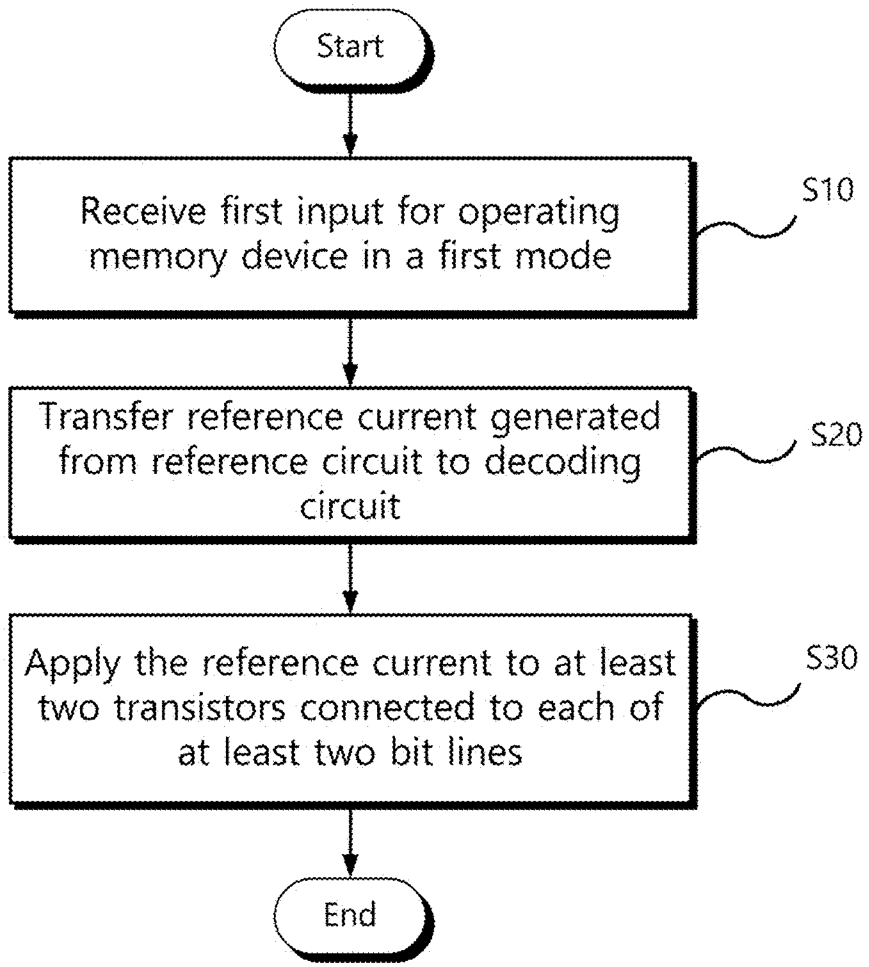
FIG. 6 is a flowchart illustrating a method of controlling a memory device according to an example embodiment.

FIG. 6 is a flowchart illustrating a method of controlling a memory device according to an example embodiment.

Referring to FIG. 6, according to an example embodiment, the memory device 100 or the control logic circuit 150 may perform operations to apply reference current IREF to a plurality of transistors such that first current I1 flows through a plurality of bit lines.

Thus, the control logic circuit 150 may program or store data simultaneously in memory cells connected to different bitlines using the plurality of bitlines.

In operation S10, the method may include receiving a first input related to an operation of the memory device. For example, the control logic circuit 150 according to an example embodiment may receive a first input for the memory device 100 to operate in a first mode.

For example, the first mode may be understood as an operation of inputting predetermined data to the plurality of memory cells included in the memory cell array 110 and reading data from the memory cells to determine whether the memory device 100 operates normally.

For example, the control logic circuit 150 may receive a first input for the memory device 100 to operate in the first mode through a memory controller or interface.

In operation S20, the method may include transferring a reference current to a decoding circuit. For example, the control logic circuit 150 may transmit the reference current IREF, generated by a reference circuit 121, to the decoding circuit 122.

For example, the control logic circuit 150 may control the reference circuit 121 such that the reference current IREF, generated by the reference circuit 121, is transmitted or sent to the decoding circuit 122.

The control logic circuit 150 may control at least one electrical path connected to the reference circuit 121 such that the reference current IREF, generated by the reference circuit 121, is transmitted or sent to the decoding circuit 122.

For example, the control logic circuit 150 may turn on at least one switch, connected between the reference circuit 121 and the decoding circuit 122, in response to the first input.

In operation S30, the method may include applying the reference current to at least two transistors connected to at least two bitlines. For example, the control logic circuit 150 may apply the reference current IREF to at least two transistors connected to at least two bitlines.

For example, the control logic circuit 150 may apply the reference current IREF to transistors connected to at least two bitlines such that the first current I1 flows through at least two bitlines connected to the first multiplexer MUX1.

The control logic circuit 150 may control the decoding circuit 122 to apply the reference current IREF to at least two transistors, connected to at least two or more bit lines connected to the first multiplexer MUX1, such that the first current I1 flows through the at least two bitlines.

For example, the control logic circuit 150 may control the decoding circuit 122 to apply the reference current IREF to at least two transistors arranged alternately, among the plurality of transistors included in the first multiplexer MUX1.

As the reference current IREF is applied to at least two transistors, the first current I1 may flow through the bitlines connected to each of the transistors to which the reference current IREF is applied.

In addition, as the first current I1 flows through the bitlines, data may be stored in memory cells, connected to bitlines through which the first current I1 flows, in the memory cell array 110.

Referring to the above-described configurations, the control logic circuit 150 according to an example embodiment may apply the reference current IREF to at least two transistors included in the multiplexer. In this case, the first current I1 may flow through the bitlines connected to the transistors to which the reference current IREF is applied.

This may allow the control logic circuit 150 to simultaneously store data in memory cells, connected to different bit lines, using a plurality of bitlines through which the first current I1 flows, respectively.

Accordingly, through the above-described configurations, the memory device 100 according to an example embodiment may reduce the time required to store data in the memory cell array 110.

For example, the memory device 100 may reduce the time required to store data in the memory cell array 110 so as to test the memory device 100.

Figure 7:
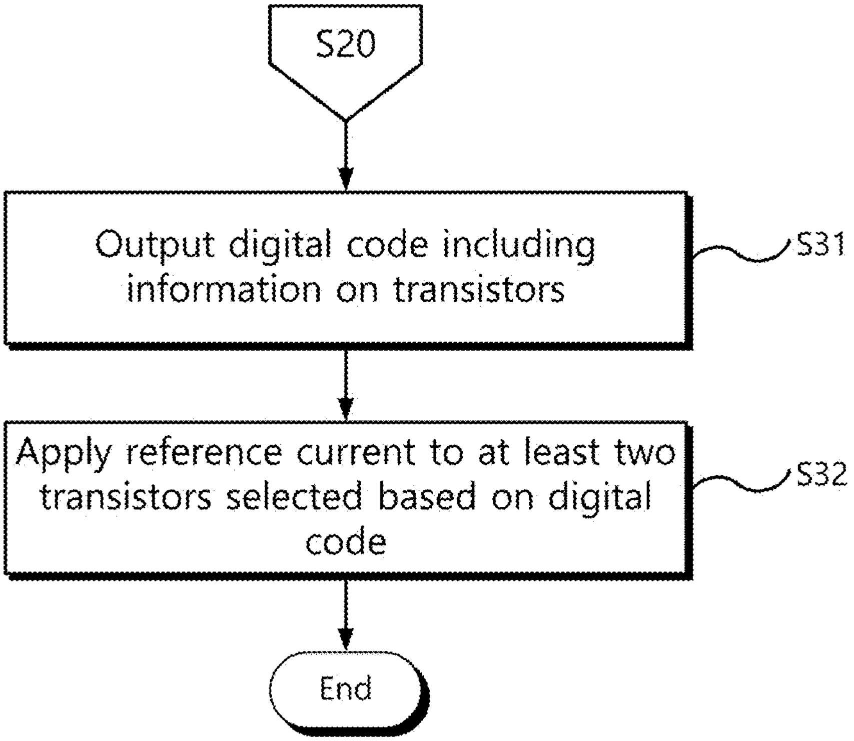
FIG. 7 is a flowchart illustrating an operation, in which a control logic circuit controls a decoding circuit to apply reference current to a multiplexer, according to an example embodiment.

FIG. 7 is a flowchart illustrating an operation, in which a control logic circuit controls a decoding circuit to apply reference current to a multiplexer, according to an example embodiment.

Referring to FIGS. 6 and 7, the memory device 100 (or the control logic circuit 150) according to an example embodiment may apply the reference current IREF to at least two transistors of a multiplexer, based on a digital code.

In operation S31, the method may include outputting a digital code. For example, the control logic circuit 150 may output a digital code including information related to transistors.

For example, the control logic circuit 150 may control the driver circuit 411 of the decoding circuit 122 to output a digital code including information about at least two transistors.

For example, referring to FIGS. 4 and 7, the control logic circuit 150 may transmit a row address YADD to the driver circuit 411 of the decoding circuit 122.

The driver circuit 411 may decode the row address YADD using the digital logic 420.

Also, the driver circuit 411 may decode the row address YADD to generate a row select signal Ysel. The row select signal Ysel may be generated in the form of a digital code. Accordingly, the row select signal Ysel may be referred to as a digital code.

In an example embodiment, the control logic circuit 150 may generate a first digital code for selecting at least two transistors, among the plurality of transistors included in the first multiplexer MUX1, in response to a first input allowing the memory device 100 to operate in the first mode.

In an example embodiment, the control logic circuit 150 may generate a second digital code for selecting a single transistor, among the plurality of transistors included in the first multiplexer MUX1, in response to a second input allowing the memory device 100 to operate in a second mode.

In operation S32, the method may include applying the reference current IREF to the at least two transistors based on the digital code. For example, the control logic circuit 150 according to an example embodiment may apply the reference current IREF to at least two transistors selected based on the digital code.

For example, the control logic circuit 150 may apply the reference current IREF to at least two transistors, among the plurality of transistors included in the first multiplexer MUX1, selected based on the digital code.

Referring to the above-described configurations, the control logic circuit 150 according to an example embodiment may apply the reference current IREF to at least two transistors included in s multiplexer. In this case, the first current I1 may flow through bitlines connected to transistors to which the reference current IREF is applied.

Thus, the control logic circuit 150 may store simultaneously data in memory cells, connected to different bitlines simultaneously using a plurality of bitlines through which the first current I1 flows, respectively.

Accordingly, through the above-described configurations, the memory device 100 may reduce the time required to store data in the memory cell array 110.

For example, the memory device 100 may reduce the time required to store data in the memory cell array 110 so as to test the memory device 100.

Figure 8:
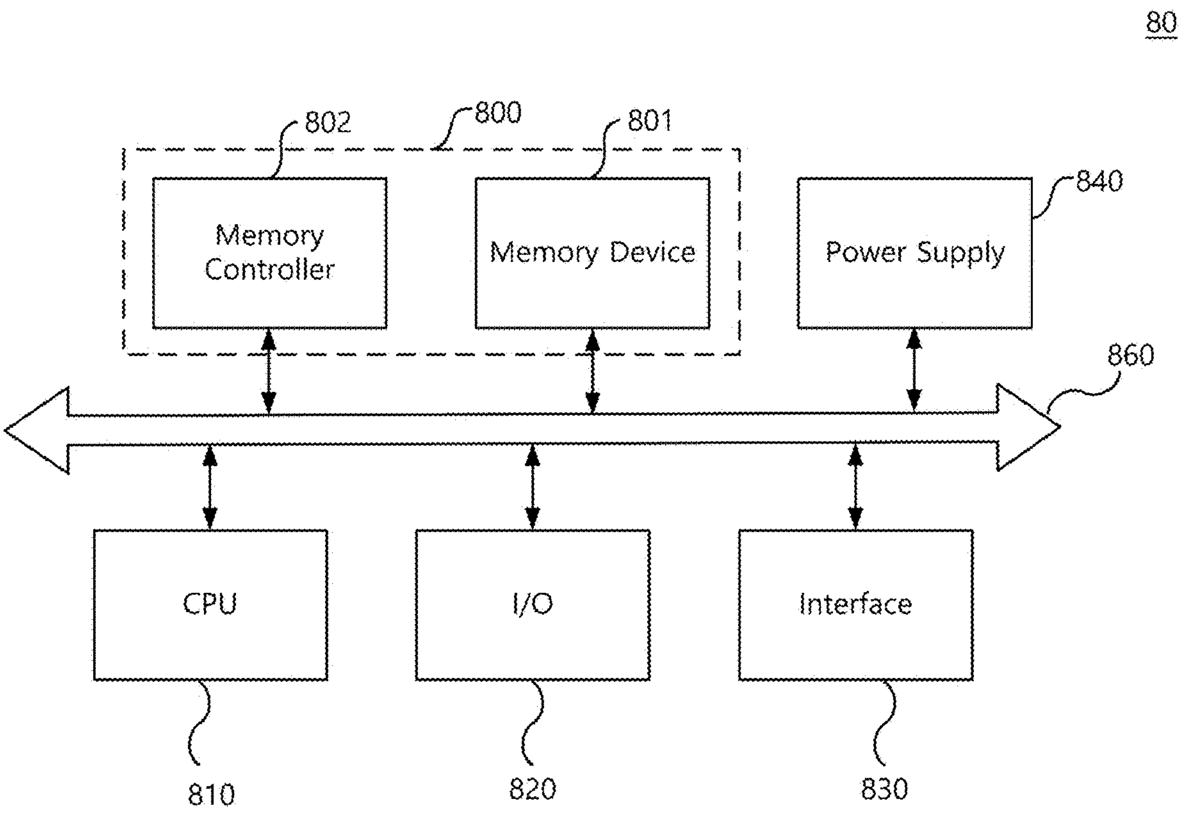
FIG. 8 is a block diagram of a computing system including a memory device according to an example embodiment.

FIG. 8 is a block diagram of a computing system including a memory device according to an example embodiment.

Referring to FIG. 8, a computing system 80 may include a central processing unit (CPU) 810, an input/output device (I/O) 820, an interface 830, a power supply 840, and a memory system 800.

The CPU 810, the I/O device 820, the interface 830, the power supply 840, and the memory system 800 may be coupled to each other through a bus 860. The bus 860 may be understood as a path through which data is exchanged between the various components of the computing system 80. For example, a plurality of pieces of data may move to and/or from the various components of the computing system 80 through the bus 860.

In an example embodiment, the CPU 810 may include a single core or multiple cores to process data. For example, the CPU 810 may include a single core processor or a multi-core processor such as a dual-core processor, a quad-core processor, or a hexa-core processor. The CPU 810 may further include various hardware devices. For example, the CPU 810 may include, but is not limited to, intellectual property (IP) cores, an internal or external cache memory.

In an example embodiment, the I/O device 820 may include one or more input devices such as a keyboard or a touchscreen, and/or one or more output devices such as a speaker or a display device.

In an example embodiment, the interface 830 may be a communication interface. For example, the interface may be implemented by circuitry and electronic components. The interface 830 may perform wireless or wired communication with an external device. For example, the interface 830 may perform Ethernet communication, near field communication (NFC), radio-frequency identification (RFID) communication, mobile communication, memory card communication, universal serial bus (USB) communication, or the like. However, the disclosure is not limited thereto, and as such, the interface 830 may perform other types of communication.

In an example embodiment, the memory system 800 may store data processed by the CPU 810, or operate as a working memory of the CPU 810. The memory system 800 may include a memory device 801 and a memory controller 802.

The memory device 801 may be understood as an example of the memory device 100 illustrated in FIG. 1.

In an example embodiment, the memory device 801 may receive an input to control a mode of the memory device 801 through the I/O device 820 or the interface 830.

For example, the memory device 801 may receive input for the memory device 801 to operate in a first mode from a user through an input device such as a keyboard or a touchscreen.

In another example, the memory device 801 may receive input for the memory device 801 to operate in the first mode from an external device through the interface 830.

For example, the memory device 801 may receive input for the memory device 801 to operate in a second mode from a user through an input device such as a keyboard or a touchscreen.

According to an example embodiment, the memory device 801 may simultaneously program or store data in memory cells connected to different bitlines using a plurality of bitlines based on a first input.

For example, the memory device 801 may simultaneously program or store data in memory cells connected to different bitlines using a plurality of bitlines in response to a first input. This may allow the memory device 801 to reduce the time required for an operation of storing data in a memory cell so as to test the memory device 801 or the memory system 800.

In an example embodiment, the power supply 840 may convert externally input power and supply the converted power to at least a portion of each component of the computing system 80 (for example, the CPU 810 or the I/O device 820).

The computing system 80 may further include a nonvolatile memory device. For example, the nonvolatile memory device may include, but is not limited to, a variety of nonvolatile memory devices such as a read only memory (ROM), a programmable ROM (PROM), an electrically programmable ROM (EPROM), an electrically erasable programmable ROM (EEPROM), a flash memory, a phase change RAM (PRAM), a resistive RAM (RRAM), or a ferroelectric RAM (FRAM).

In an example embodiment, the computing system 80 may be referred to as any computing system such as a mobile phone, a smartphone, a personal digital assistant (PDA), a portable multimedia player (PMP), a digital camera, a music player, a portable game console, a navigation system, or the like.

Figure 9:
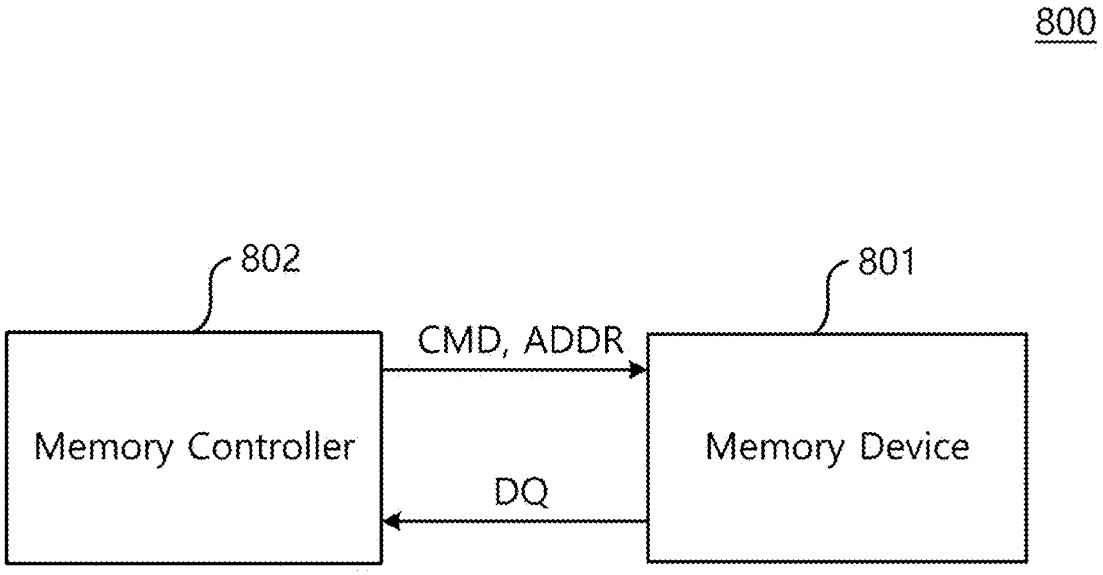
FIG. 9 is a block diagram of a memory system including a memory device according to an example embodiment.

FIG. 9 is a block diagram of a memory system including a memory device according to an example embodiment.

Referring to FIG. 9, the memory system 800 may include a memory device 801 and a memory controller 802.

In an example embodiment, the memory controller 802 may be configured to control the memory device 801. For example, the memory controller 802 may be configured to control one or more operations of the memory device 801.

The memory controller 802 may access the memory device 801 based on a request from a host. The memory controller 802 may access the memory device 801 in response to a request from a host. For example, the memory controller 802 may program data in the memory device 801 or read data from the memory device 801.

For example, the memory controller 802 may provide a command CMD, an address ADDR to the memory device 801 and exchange data DQ with the memory device 801. The memory controller 802 may be configured to run firmware to control the memory device 801.

In an example embodiment, the memory device 801 may be configured to store data. For example, the memory device 801 may include an electrically erasable programmable read-only memory (EEPROM), a flash memory, a magnetic RAM (MRAM), a spin-transfer torque (MRAM), a conductive bridging RAM (CBRAM), a ferroelectric RAM (FeRAM), a phase change RAM (PRAM), a resistive RAM (RRAM), a nanotube RRAM, a polymer RAM (PoRAM), a nano floating gate memory (NFGM), a holographic memory, a molecular electronics memory device, or an insulator resistance change memory.

The memory device 801 may be understood as an example of the memory device 100 illustrated in FIG. 1.

In an example embodiment, the memory device 801 may simultaneously program (or store) data in memory cells connected to different bitlines using a plurality of bitlines under the control of the memory controller 802.

For example, the control logic circuit 150 of the memory device 801 may simultaneously program (or store) data in memory cells connected to a plurality of bitlines based on a control signal (for example, a command CMD and/or an address ADDR) transmitted from the memory controller 802.

This may allow the memory device 801 to reduce the time required for an operation of storing data in a memory cell so as to test the memory device 801 (or the memory system 800).

As described above, the control logic circuit 150 according to an example embodiment may apply reference current IREF to at least two transistors included in the multiplexer. In this case, a first current may flow through bitlines connected to transistors to which the reference current IREF is applied.

This may allow the control logic circuit 150 to simultaneously store data in memory cells connected to different bitlines using a plurality of bitlines.

Accordingly, the memory device 100 may reduce the time required to store data in the memory cell array 110. For example, the memory device 100 may reduce the time required to store data in the memory cell array 110 so as to test the memory device 100. That is, a time required to store data in the memory cell array 110 may be reduced.

In addition, the control logic circuit 150 may control a multiplexer such that current having the same value flows through a plurality of bitlines, regardless of resistance (for example, line resistance) values of the bitlines.

This may allow the memory device 100 to significantly reduce an effect caused by the resistance value of each bitline in a case in which data is programmed or stored in memory cells through a plurality of bitlines.

As set forth above, a memory device according to example embodiments may simultaneously store data in memory cells connected to different bitlines using reference current.

As a result, the memory device may reduce time required to store data in a memory cell array.

While example embodiments have been shown and described above, it will be apparent to those skilled in the art that modifications and variations could be made without departing from the scope of the present inventive concept as defined by the appended claims.

What is claimed is:

1. A memory device comprising:
a memory cell array comprising a plurality of memory cells, respectively connected to a plurality of bitlines;
a first multiplexer comprising a plurality of transistors connected to the plurality of bitlines;
a reference circuit configured to generate a reference current;
a decoding circuit comprising: a driver circuit comprising a digital logic; and a transmission circuit configured to transmit the reference current to the first multiplexer; and
a control logic circuit configured to:
control the decoding circuit to apply the reference current to at least two transistors among the plurality of transistors in the first multiplexer through the transmission circuit based on digital code output by the digital logic, the at least two transistors respectively connected to at least two bitlines among the plurality of bitlines.

2. The memory device of claim 1, wherein the control logic circuit is configured to transmit the reference current to the decoding circuit based on a first input related to a first operation mode of the memory device.

3. The memory device of claim 2,
wherein the driver circuit comprises:
a first driver transistor connected to a power supply;
a second driver transistor connected to a ground; and
a third driver transistor connected between the first driver transistor and the second driver transistor, and
wherein, based on the first input, the control logic circuit is configured to:
turn on the third driver transistor and the transmission circuit;
turn off the first driver transistor and the second driver transistor; and
control the digital logic to output a first digital code to apply the reference current to the at least two transistors in the first multiplexer.

4. The memory device of claim 3, wherein, based on a second input related to a second operation mode of the memory device, the control logic circuit is configured to:
turn off the third driver transistor and the transmission circuit;
turn on the first driver transistor and the second driver transistor; and
control the digital logic to output a second digital code to apply a voltage, greater than or equal to a threshold voltage, to a single transistor, among the plurality of transistors in the first multiplexer.

5. The memory device of claim 1, further comprising:
a row decoder connected to the control logic circuit, the row decoder configured to select at least one wordline,
wherein the control logic circuit is configured to store data in memory cells connected to the at least one wordline, and the at least two bitlines through which a first current flows.

6. The memory device of claim 5, wherein
the first multiplexer is configured to output current, equal to a product of the first current and a number of transistors applied with the reference current among the plurality of transistors, based on the reference current being applied to the first multiplexer.

7. The memory device of claim 1, wherein
the control logic circuit is configured to provide a row address to the decoding circuit, and
the driver circuit is configured to decode the row address through the digital logic and generate the digital code.

8. The memory device of claim 4, further comprising:
an output transistor connected to the first multiplexer,
wherein the control logic circuit is configured to apply the reference current to the output transistor based on to the second input.

9. The memory device of claim 1, wherein
the control logic circuit is configured to apply the reference current to transistors arranged alternately, among the plurality of transistors included in the first multiplexer.

10. A memory system comprising:
a memory device; and
a memory controller configured to control the memory device,
wherein the memory device comprises:
a memory cell array comprising a plurality of memory cells, respectively connected to a plurality of bitlines;
a plurality of multiplexers, each comprising a plurality of transistors connected to each of a specific number of bitlines, among the plurality of bitlines;
a reference circuit configured to generate reference current;
a decoding circuit comprising: a driver circuit comprising a digital logic; and a transmission circuit configured to transmit the reference current to a first multiplexer, among the plurality of multiplexers; and
a control logic circuit configured to apply the reference current to at least two transistors in the first multiplexer through the transmission circuit based on digital code output by the digital logic, based on a control signal transmitted from the memory controller.

11. The memory system of claim 10, further comprising:
a row decoder connected to the control logic circuit, the row decoder configured to select at least one wordline,
wherein the control logic circuit is configured to store data in memory cells connected to the at least one wordline and bitlines connected to the at least two transistors in the first multiplexer through which a first current flows as the reference current is applied.

12. The memory system of claim 11,
wherein the driver circuit comprises:
a first driver transistor connected to a power supply;
a second driver transistor connected to a ground; and
a third driver transistor connected between the first driver transistor and the second driver transistor, and
wherein, based on a first input related to a first operation mode of the memory device, the control logic circuit is configured to: turn on the third driver transistor and the transmission circuit;
turn off the first driver transistor and the second driver transistor; and
control the digital logic to output a first digital code to apply the reference current to the at least two transistors in the first multiplexer.

13. The memory system of claim 12, wherein
the control logic circuit is configured to transmit the reference current to the decoding circuit based on the first input.

14. The memory system of claim 11, wherein
the first multiplexer is configured to output current, equal to a product of the first current and a number of transistors applied with the reference current among the plurality of transistors, based on the reference current being applied to the first multiplexer.

15. The memory system of claim 10, wherein
the control logic circuit is configured to apply the reference current to transistors arranged alternately, among the plurality of transistors in the first multiplexer.

16. A method of operating a memory device comprising:
receiving a first input related to an operation of the memory device;
generating a reference current;
transmitting the reference current to a decoding circuit based on the first input; and
controlling the decoding circuit to apply the reference current to at least two transistors among a plurality of transistors in a first multiplexer, the at least two transistors respectively connected to at least two bitlines among a plurality of bitlines of a memory cell array,
wherein the controlling the decoding circuit comprises:
controlling a driver circuit of the decoding circuit to output a digital code comprising information related to the at least two transistors; and applying the reference current to the at least two transistors based on the digital code.

17. The programming method of claim 16, wherein the controlling the decoding circuit comprises:

applying the reference current to transistors arranged alternately, among the plurality of transistors in the first multiplexer.

* * * * *